(12) United States Patent
Denison et al.

(10) Patent No.: US 8,617,960 B2
(45) Date of Patent: Dec. 31, 2013

(54) SILICON MICROPHONE TRANSDUCER

(75) Inventors: Marie Denison, Plano, TX (US); Brian E. Goodlin, Plano, TX (US); Wei-Yan Shih, Plano, TX (US); Lance W. Barron, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 189 days.

(21) Appl. No.: 12/969,784

(22) Filed: Dec. 16, 2010

(65) Prior Publication Data

US 2011/0158439 A1 Jun. 30, 2011

Related U.S. Application Data

(60) Provisional application No. 61/291,760, filed on Dec. 31, 2009.

(51) Int. Cl.
*H04R 11/04* (2006.01)
*H01L 29/84* (2006.01)
*H01L 21/04* (2006.01)

(52) U.S. Cl.
USPC ........ 438/396; 216/17; 257/416; 257/E21.04; 257/E29.324; 381/174

(58) Field of Classification Search
None
See application file for complete search history.

(56) References Cited

U.S. PATENT DOCUMENTS

| | | | |
|---|---|---|---|
| 5,677,965 A * | 10/1997 | Moret et al. | 381/191 |
| 5,679,902 A * | 10/1997 | Ryhanen | 73/78 |
| 6,012,336 A * | 1/2000 | Eaton et al. | 73/754 |
| 6,584,852 B2 * | 7/2003 | Suzuki et al. | 73/718 |
| 6,901,804 B2 * | 6/2005 | Torkkeli | 73/716 |
| RE40,781 E * | 6/2009 | Johannsen et al. | 381/174 |
| 8,304,846 B2 * | 11/2012 | Shih | 257/416 |
| 8,323,955 B1 * | 12/2012 | Okandan | 435/285.2 |
| 2002/0115198 A1 * | 8/2002 | Nerenberg et al. | 435/287.2 |
| 2002/0135440 A1 * | 9/2002 | Ryhanen et al. | 333/185 |
| 2006/0008098 A1 * | 1/2006 | Tu | 381/175 |
| 2006/0081062 A1 * | 4/2006 | Silverbrook et al. | 73/754 |
| 2006/0141786 A1 * | 6/2006 | Boezen et al. | 438/689 |
| 2006/0203421 A1 * | 9/2006 | Morris et al. | 361/277 |
| 2006/0237806 A1 * | 10/2006 | Martin et al. | 257/415 |
| 2007/0058825 A1 * | 3/2007 | Suzuki et al. | 381/174 |
| 2007/0065968 A1 | 3/2007 | Kok et al. | |
| 2007/0144266 A1 * | 6/2007 | Silverbrook et al. | 73/754 |
| 2008/0158301 A1 * | 7/2008 | Silverbrook | 347/54 |

(Continued)

FOREIGN PATENT DOCUMENTS

WO WO 01-78448 10/2001

OTHER PUBLICATIONS

U.S. Appl. No. 12/969,859, filed Dec. 16, 2010 and correspondence.

*Primary Examiner* — Allan Olsen
(74) *Attorney, Agent, or Firm* — Warren L. Franz; Wade J. Brady, III; Frederick J. Telecky, Jr.

(57) ABSTRACT

A capacitive microphone transducer integrated into an integrated circuit includes a fixed plate and a membrane formed in or above an interconnect region of the integrated circuit. A process of forming an integrated circuit containing a capacitive microphone transducer includes etching access trenches through the fixed plate to a region defined for the back cavity, filling the access trenches with a sacrificial material, and removing a portion of the sacrificial material from a back side of the integrated circuit.

15 Claims, 14 Drawing Sheets

(56) References Cited

U.S. PATENT DOCUMENTS

| | | |
|---|---|---|
| 2008/0175417 A1 | 7/2008 | Kok et al. |
| 2008/0210012 A1* | 9/2008 | Silverbrook et al. ........... 73/708 |
| 2009/0056459 A1* | 3/2009 | Silverbrook et al. ........... 73/706 |
| 2009/0067659 A1* | 3/2009 | Wang et al. .................. 381/355 |
| 2009/0141913 A1* | 6/2009 | Mauer et al. ................. 381/174 |
| 2009/0169035 A1* | 7/2009 | Rombach et al. ............. 381/175 |
| 2010/0020509 A1* | 1/2010 | Xie et al. ...................... 361/748 |
| 2010/0158279 A1* | 6/2010 | Conti et al. ................... 381/174 |
| 2010/0285628 A1* | 11/2010 | Martin et al. .................... 438/53 |
| 2011/0073967 A1* | 3/2011 | Chen et al. .................... 257/416 |
| 2011/0096122 A1* | 4/2011 | Silverbrook .................... 347/44 |
| 2011/0300659 A1* | 12/2011 | Hsieh et al. ...................... 438/53 |

* cited by examiner

SILICON MICROPHONE TRANSDUCER

CROSS-REFERENCE TO RELATED APPLICATIONS

The following co-pending patent application is related and hereby incorporated by reference: U.S. patent application Ser. No. 12/969,859, filed Dec. 16, 2010. With its mention in this section, this patent application is not admitted to be prior art with respect to the present invention.

FIELD OF THE INVENTION

This invention relates to the field of integrated circuits. More particularly, this invention relates to microphone transducer transducers in integrated circuits.

BACKGROUND OF THE INVENTION

Integration of microphone transducer transducers including backside cavities into integrated circuits has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A capacitive microphone transducer transducer integrated into an integrated circuit includes a fixed plate and a membrane formed in or above an interconnect region of the integrated circuit. A process of forming the capacitive microphone transducer transducer includes etching access trenches through the fixed plate, forming a back cavity, forming a sacrificial fill region of sacrificial material, and removing a portion of the sacrificial material from a back side of the integrated circuit.

In a described example embodiment, a process is provided of forming an integrated circuit including a movable membrane. An interconnect layer for interconnecting underlying circuit elements is formed over a substrate. A first conductive material layer is formed over the interconnect layer. The first conductive layer is patterned to define a first capacitor plate positioned between and separated from second capacitor plate terminals, and to form cavity access openings through the capacitor plate. The interconnect layer is selectively etched through the cavity access openings to form corresponding access trenches down to the substrate. A sacrificial layer is formed over the patterned first conductive layer including over the first capacitor plate and the second capacitor plate terminals and extending into the trenches. The first sacrificial layer is patterned to form vias peripherally of the first capacitor plate down to and exposing the second capacitor plate terminals. A second conductive material layer is formed over the patterned first sacrificial layer to define a second capacitor plate having a first portion spaced above the first capacitor plate and a second portion peripheral to the first portion extending down into the vias into contact with the exposed second capacitor plate terminals. An opening which connects to the trenches is formed in a backside of the substrate. Thereafter, the first sacrificial layer is removed to define a cavity between the first portion of the second conductive material and the first capacitor plate in communication with the backside cavity through the cavity access openings and in which the first portion of the second capacitor plate may move in electrical attraction to or repulsion from the first capacitor plate; the second capacitor plate being dimensioned and configured to allow such movement.

In described implementations, a second sacrificial layer may be formed over the second conductive material prior to forming the opening in the backside of the substrate; and the second sacrificial layer is removed after forming the opening in the backside of the substrate. The second conductive material layer may be patterned to define openings through the first portion of the second capacitor plate in communication with the cavity between the first portion and the first capacitor plate. Also, the second conductive material layer may be formed to provide a stress relief configuration, such as corrugations, between the first and second portions of the second capacitor plate. A third conductive material layer may be formed on the second conductive material layer at least in the first and second portions of the second capacitor plate, but not over the corrugations. The third conductive layer may extend down into the vias.

DETAILED DESCRIPTION

Figure 1A:
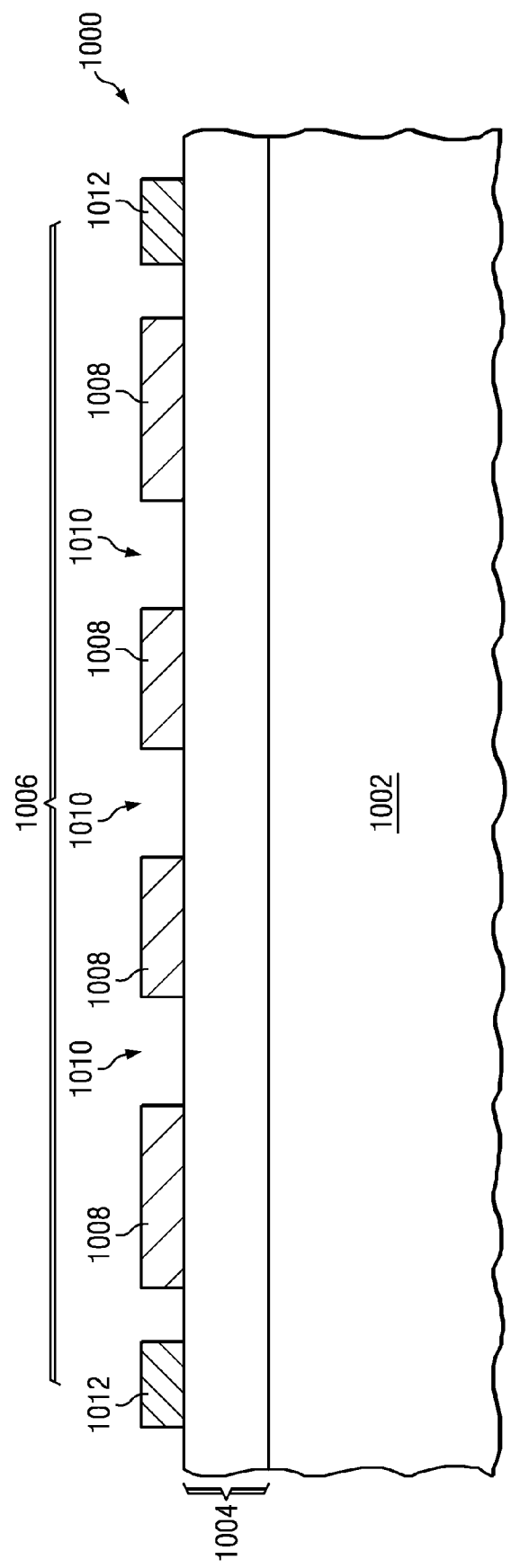
FIG. 1A through FIG. 1G are cross-sections of an integrated circuit containing a capacitive microphone transducer transducer formed according to a first embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A capacitive microphone transducer formed in an integrated circuit includes a fixed plate of a microphone transducer capacitor, a membrane plate, referred to herein as a membrane, of the microphone transducer capacitor, and a back cavity. The membrane responds to acoustic waves in an ambient above the integrated circuit by moving up and down relative to the fixed plate. The back cavity is an open region located below the fixed plate and membrane, extending through a substrate of the integrated circuit.

A capacitive microphone transducer may be integrated into an integrated circuit by forming the fixed plate and the membrane of interconnect elements of the integrated circuit. The capacitive microphone transducer may further be integrated into the integrated circuit by forming access trenches through the fixed plate, forming a back cavity, forming a sacrificial fill region of sacrificial material, and removing a portion of the sacrificial material from a back side of the integrated circuit.

FIG. 1A through FIG. 1G are cross-sections of an integrated circuit containing a capacitive microphone transducer formed according to a first embodiment, depicted in successive stages of fabrication. The integrated circuit may digital circuits such as complementary metal oxide semiconductor (CMOS) circuits, analog circuits, or a combination of digital and analog circuits. The integrated circuit may contain components such as inductors, capacitors, a charge pump for example to provide power to the capacitive microphone transducer, an amplifier such as a junction field effect transistor (JFET) based amplifier, or other components. Referring to FIG. 1A, the integrated circuit (1000) is formed in and on a substrate (1002), which may be a single crystal silicon wafer, or may be a silicon-on-insulator (SOI) wafer, or other material appropriate for fabrication of the integrated circuit (1000). The integrated circuit (1000) includes a first interconnect region (1004) of one or more layers of interconnect levels and dielectric layers formed over the substrate (1002). In one realization of the instant embodiment, a top surface of the first interconnect region (1004) in a microphone transducer area (1006) defined for the capacitive microphone transducer is substantially free of metal interconnect elements such as contacts, metal interconnect lines or vias. In one realization of the instant embodiment, the microphone transducer area (1006) may be between 100 microns and 2 millimeters wide. A fixed plate (1008) of the capacitive microphone transducer is formed on a top surface of the first interconnect region (1004). In one realization of the instant embodiment, the fixed plate (1008) may be formed concurrently with horizontal interconnect elements (not shown in FIG. 1A) in the integrated circuit (1000). In a further embodiment, the fixed plate (1008) may include copper. In an alternate embodiment, the fixed plate (1008) may include aluminum or aluminum with copper. Cavity access openings (1010) are formed in the fixed plate (1008) to accommodate cavity access trenches formed in subsequent fabrication steps. Membrane terminals (1012) may be formed over the first interconnect region (1004).

Figure 1B:
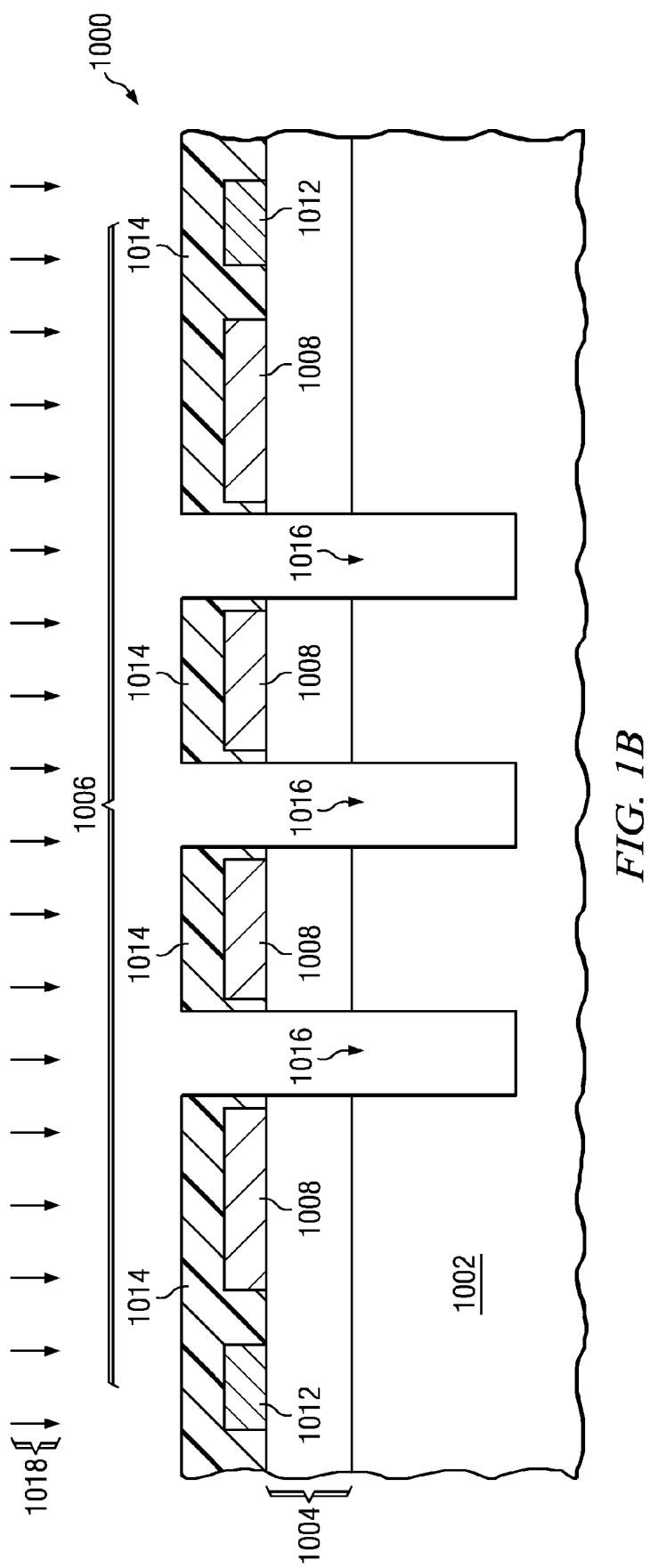
Figure 1C:
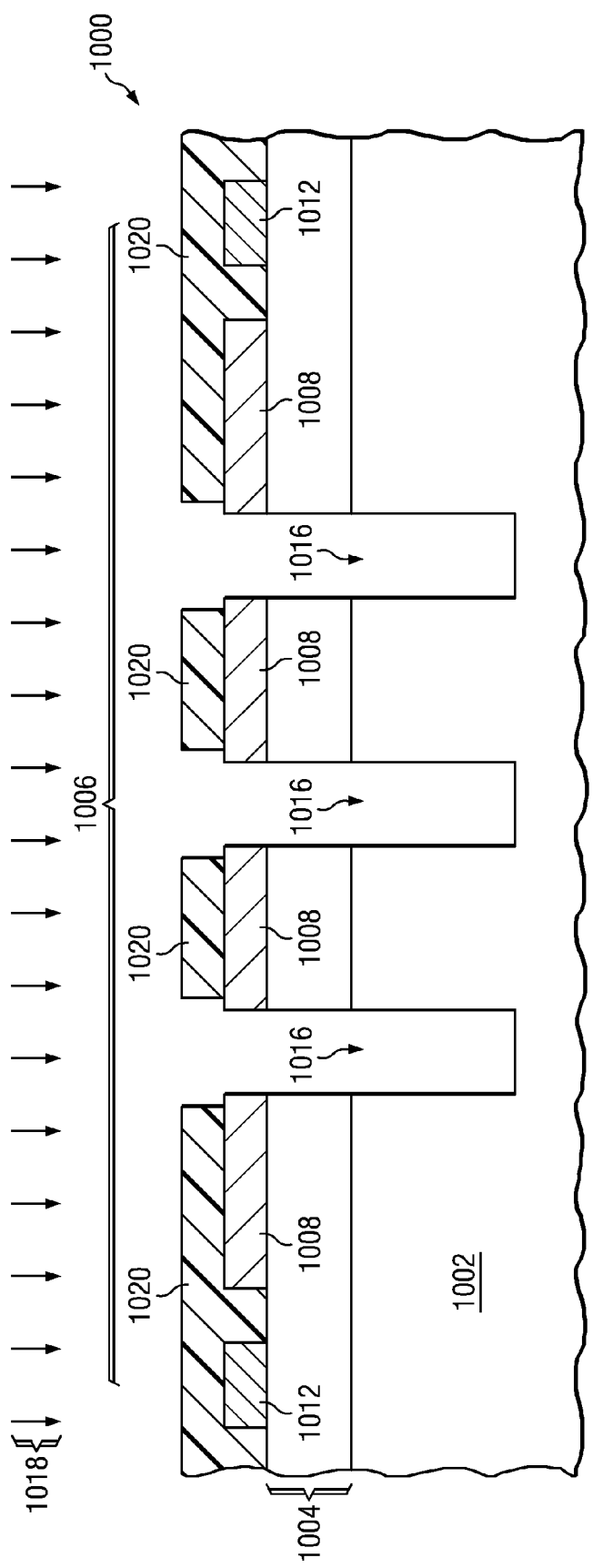

FIG. 1B and FIG. 1C depict alternate processes for forming access trenches in the integrated circuit (1000). Referring to FIG. 1B, an access trench photoresist pattern (1014) is formed on an existing top surface of the integrated circuit (1000) to define areas for access trenches (1016). In the realization of the instant embodiment depicted in FIG. 1B, the access trench photoresist pattern (1014) overlaps edges of the fixed plate (1008). In one realization of the instant embodiment, the access trenches (1016) may be between 500 nanometers and 10 microns wide, and between 1 micron and 100 microns deep. The access trenches (1016) are formed by an access trench etch process (1018), for example a reactive ion etch (RIE) process using a fluorine containing plasma. Other processes, such as laser ablation, which may be used to form the access trenches (1016) are within the scope of the instant embodiment. In one realization of the instant embodiment, the access trench photoresist pattern (1014) may be removed after formation of the access trenches (1016) is completed, for example by exposing the integrated circuit (1000) to an oxygen containing plasma, followed by a wet cleanup.

Referring to FIG. 1C, an alternate access trench photoresist pattern (1020) is formed on an existing top surface of the integrated circuit (1000) to define areas for access trenches (1016). In the realization of the instant embodiment depicted in FIG. 1C, the alternate access trench photoresist pattern (1020) does not overlap edges of the fixed plate (1008). Access trenches (1016) are formed as described in reference to FIG. 1B.

Figure 1D:
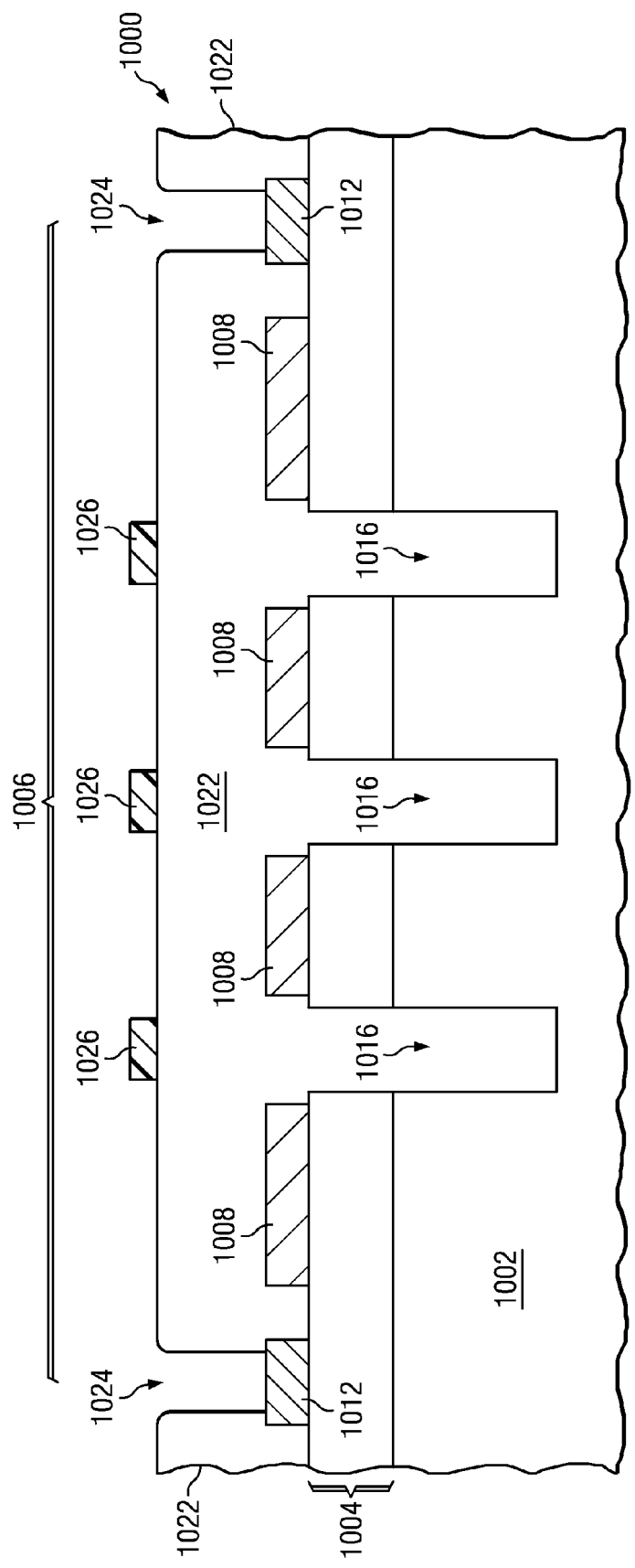

Referring to FIG. 1D, a cavity fill sacrificial layer (1022) is formed on the fixed plate (1008) extending into the access trenches (1016). The cavity fill sacrificial layer (1022) can be removed in a subsequent fabrication step while removing substantially no material from the first interconnect region (1004). In one realization of the instant embodiment, the cavity fill sacrificial layer (1022) may include an organic polymer such as photoresist, polyimide, or phenolic resin. In an alternate embodiment, the cavity fill sacrificial layer (1022) may include a compound of silicon and oxygen, such as a porous silicon dioxide. In a further embodiment, the cavity fill sacrificial layer (1022) may include another inorganic material. The cavity fill sacrificial layer (1022) is sized for a desired spacing between the fixed plate (1008) and a membrane of the capacitive microphone transducer. If the membrane terminals (1012) are present, terminal via holes (1024) may be formed in the cavity fill sacrificial layer (1022). The cavity fill sacrificial layer (1022) may optionally be planarized to provide a desired thickness and surface planarity. In one realization of the instant embodiment, patterned planarization buffers (1026) may be formed on a top surface of the cavity fill sacrificial layer (1022) to provide more uniform planarization, for example during a chemical mechanical polishing (CMP) process. The patterned planarization buffers (1026) may be completely removed during the planarization process.

Figure 1E:
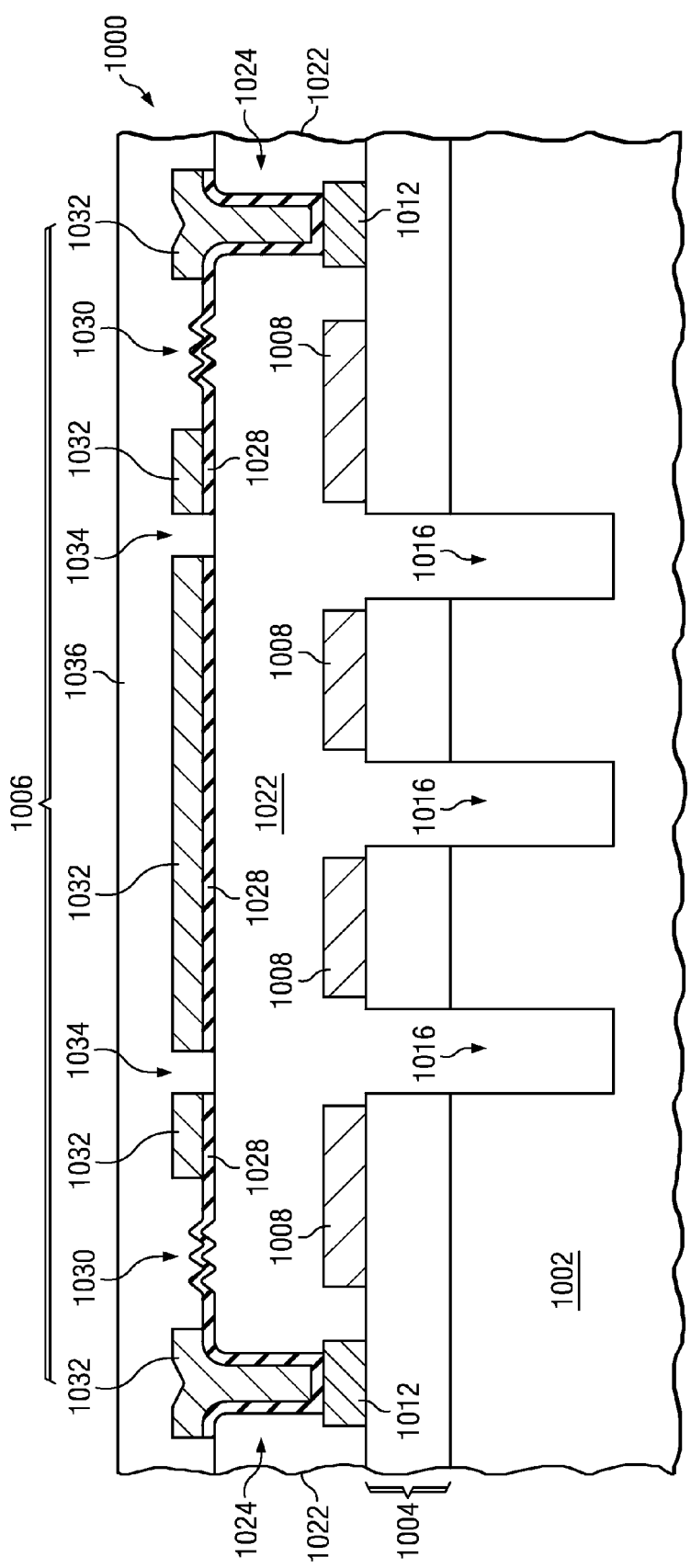

Referring to FIG. 1E, a first membrane layer (1028) is formed on a top surface of the cavity fill sacrificial layer (1022). In one realization of the instant embodiment, the first membrane layer (1028) may be formed concurrently with liner metal elements of interconnects (not shown in FIG. 1E) in the integrated circuit (1000). In a further embodiment, the first membrane layer (1028) may include tantalum nitride (TaN), titanium nitride (TiN), titanium aluminum (TiAl) or a combination thereof. In other embodiments, the first membrane layer (1028) may include aluminum or aluminum with copper. In yet other embodiments, the first membrane layer (1028) may include dielectric materials such as silicon nitride, silicon oxy-nitride, silicon carbide, silicon nitride carbide or silicon oxy-nitride carbide. In some embodiments, the first membrane layer (1028) may be formed of combinations of the aforementioned materials. The first membrane layer (1028) may contact membrane terminals (1012), if present. The first membrane layer (1028) may include optional performance enhancement features (1030), such as corrugations or other stress relief configurations, which may increase responsiveness of the capacitive microphone transducer to acoustic waves. If terminal via holes (1024) are present, the first membrane layer (1028) may be formed on sidewalls of the terminal via holes (1024) and exposed surfaces of the membrane terminals (1012).

An optional second membrane layer (1032) is formed on a top surface of the first membrane layer (1028). In one realization of the instant embodiment, the second membrane layer (1032) may be formed concurrently with elements of interconnects (not shown in FIG. 1E) in the integrated circuit (1000). If terminal via holes (1024) are present, the second membrane layer (1032) may be formed in the terminal via holes (1024). In a further embodiment, the second membrane layer (1032) may include copper. In an alternate embodiment, the second membrane layer (1032) may include aluminum or aluminum with copper. In one realization of the instant embodiment, lateral edges of a main first portion of the second membrane layer (1032) do not extend to lateral edges of the first membrane layer (1028). This is illustrated by the main first portion of the second membrane layer (1032) shown between the optional performance enhancement features (1030), laterally spaced from separate peripheral second portions formed in the terminal via holes (1024). Pressure equalization apertures (1034) may be formed in the first membrane layer (1028) and/or through the combined first membrane layer (1028) and second membrane layer (1032), for example by patterning areas for the pressure equalization apertures (1034) concurrently with patterning areas for the first membrane layer (1028) and/or the second membrane layer (1032).

After formation of the first membrane layer (1028) and the second membrane layer (1032) if present, a sacrificial protective layer (1036) is formed over the first membrane layer (1028) and the second membrane layer (1032). The sacrificial protective layer (1036) includes a sacrificial material that can be removed in a subsequent fabrication step while removing substantially no material from the first membrane layer (1028) and the second membrane layer (1032). In one realization of the instant embodiment, the sacrificial protective layer (1036) may contain substantially the same material as the cavity fill sacrificial layer (1022).

Figure 1F:
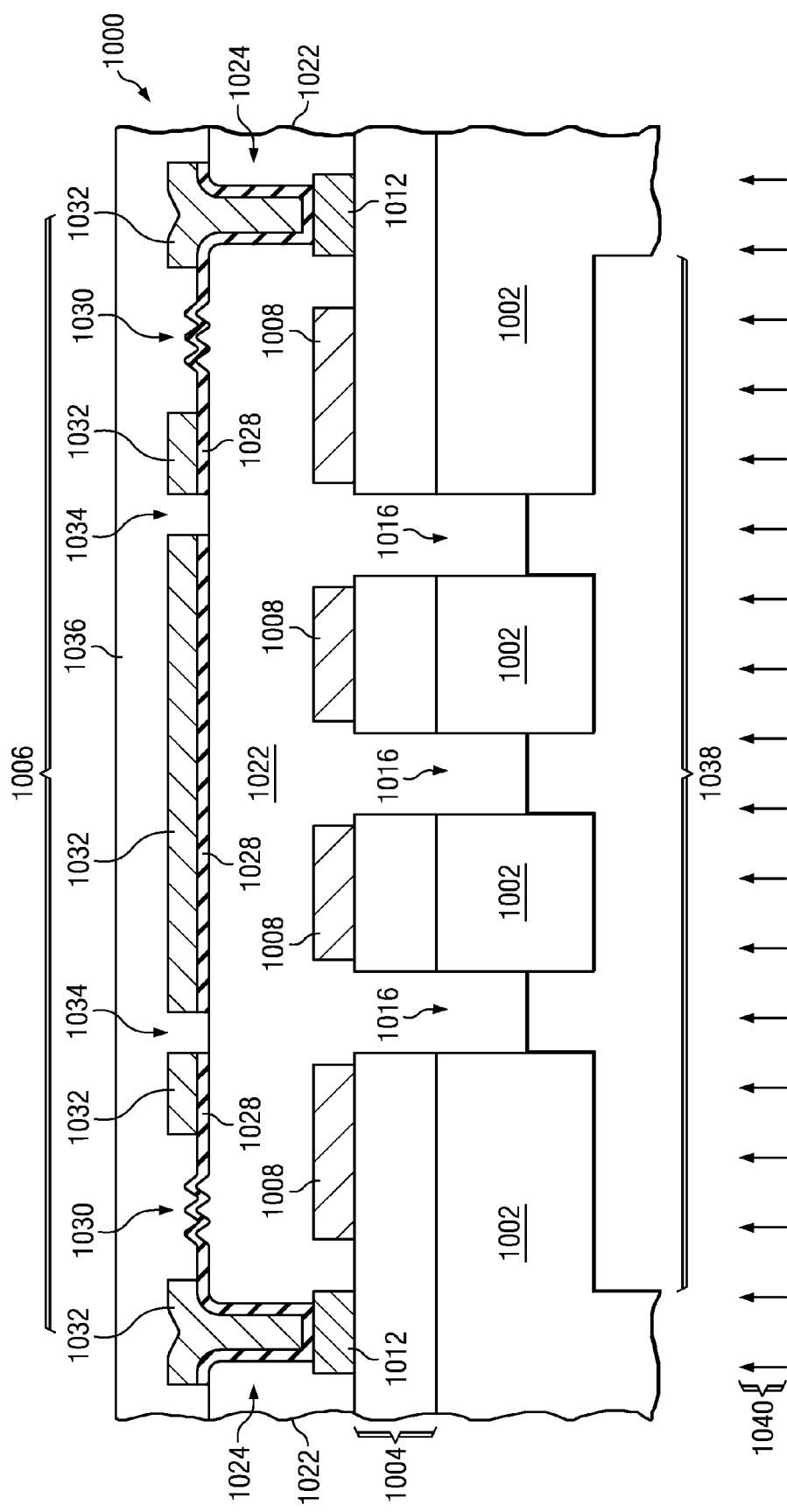

Referring to FIG. 1F, a backside cavity (1038) is formed in the substrate (1002) which connects to the access trenches (1016). The backside cavity (1038) may be formed, for example by a deep RIE (DRIE) process or a wet etch process. A portion of the sacrificial material in the cavity fill sacrificial layer (1022) is removed from the access trenches (1016) using a backside sacrificial material removal process (1040). In one realization of the instant embodiment, the backside sacrificial material removal process (1040) may include an RIE step using an oxygen containing plasma. In an alternate embodiment, the backside sacrificial material removal process (1040) may include an asher step using reactive oxygen species. In a further embodiment, the backside sacrificial material removal process (1040) may include a step using ozone. Other means of removing sacrificial material from the access trenches (1016) are within the scope of the instant embodiment.

Figure 1G:
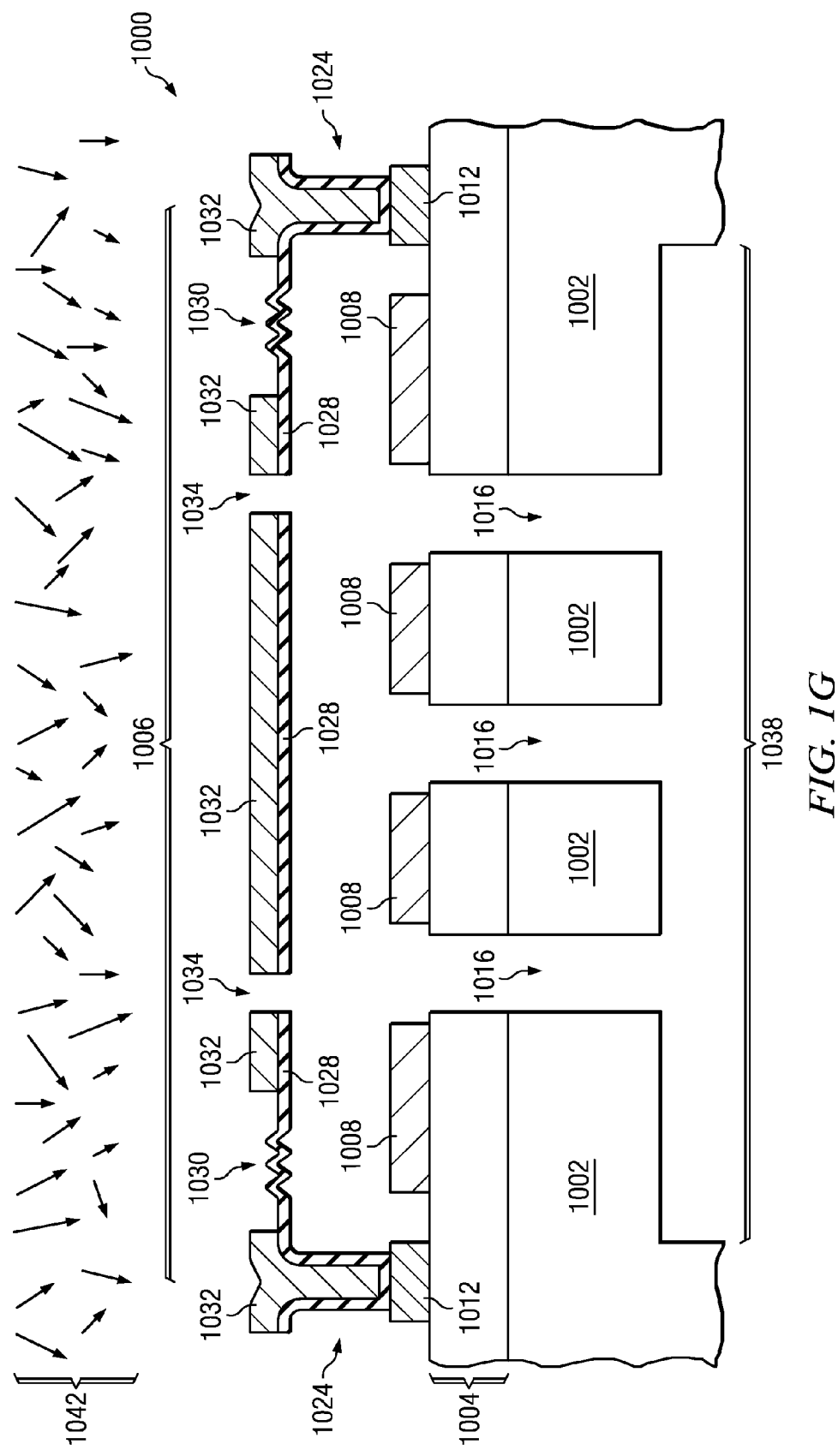

Referring to FIG. 1G, the sacrificial material in the sacrificial protective layer (1036) and in the cavity fill sacrificial layer (1022) is removed, for example by exposing the integrated circuit (1000) to a reactive ambient (1042) containing any combination of reactive oxygen species, reactive fluorine species, reactive hydrogen species and reactive nitrogen species. In one realization of the instant embodiment, the reactive ambient (1042) containing the reactive species may be generated in a downstream asher, which produces reactive species in a plasma, which subsequently diffuse from the plasma to an electric field-free region containing the integrated circuit (1000). In an alternate embodiment, the reactive ambient (1042) may be generated by an ozone generator.

Figure 2:
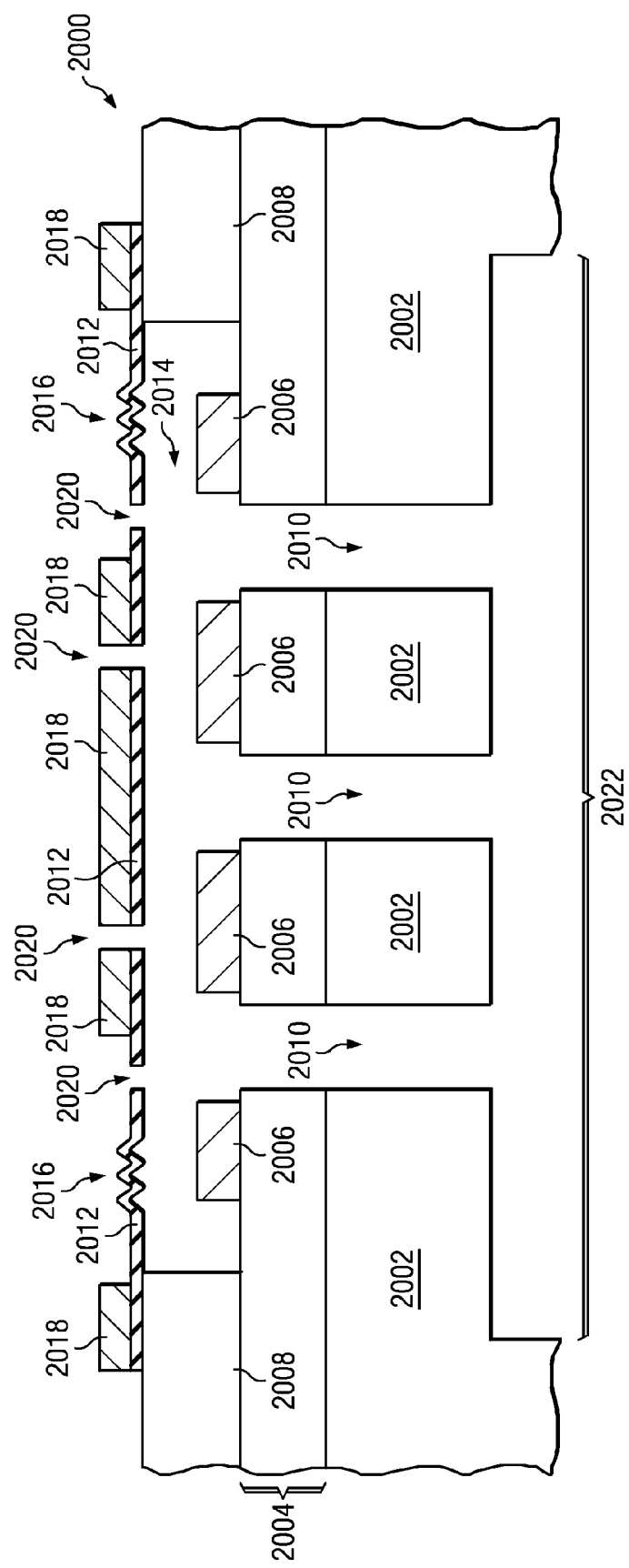
FIG. 2 is a cross-section of an integrated circuit containing a capacitive microphone transducer transducer formed according to a second embodiment.

FIG. 2 is a cross-section of an integrated circuit containing a capacitive microphone transducer formed according to a second embodiment. The integrated circuit (2000) is formed in and on a substrate (2002) as described in reference to FIG. 1A. A first interconnect region (2004) is formed over the substrate (2002) as described in reference to FIG. 1A. A fixed plate (2006) of the capacitive microphone transducer is formed on a top surface of the first interconnect region (2004). In one realization of the instant embodiment, the fixed plate (2006) may be formed concurrently with horizontal interconnect elements (not shown in FIG. 2) in the integrated circuit (2000). In a further embodiment, the fixed plate (2006) may include copper. In an alternate embodiment, the fixed plate (2006) may include aluminum. Cavity spacers (2008), possibly including interconnect regions of the integrated circuit (2000) are formed on the first interconnect region (2004) adjacent to a region defined for a microphone transducer plate cavity.

Access trenches (2010) are formed through the first interconnect region (2004) and into the substrate (2002), as described in reference to FIG. 1B. A first membrane layer (2012) is formed over a microphone transducer plate cavity (2014) using sacrificial material as described in reference to FIG. 1D through FIG. 1G. In the instant embodiment, the first membrane layer (2012) overlaps the cavity spacers (2008). In one realization of the instant embodiment, the first membrane layer (2012) may be formed concurrently with liner metal elements of interconnects (not shown in FIG. 2) of the integrated circuit (2000). The first membrane layer (2012) may include optional performance enhancement features (2016), such as corrugations or other stress relief configurations, as described in reference to FIG. 1E.

An optional second membrane layer (2018) may be formed on a top surface of the first membrane layer (2012), as described in reference to FIG. 1E. In one realization of the instant embodiment, the second membrane layer (2018) may be formed concurrently with elements of interconnects (not shown in FIG. 1E) in the integrated circuit (2000). Pressure equalization apertures (2020) may be formed in the first membrane layer (2012) and/or through the first membrane layer (2012) and second membrane layer (2018), as described in reference to FIG. 1E. A backside cavity (2022) is formed in the substrate (2002) which connects to the access trenches (2010), as described in reference to FIG. 1E.

Figure 3A:
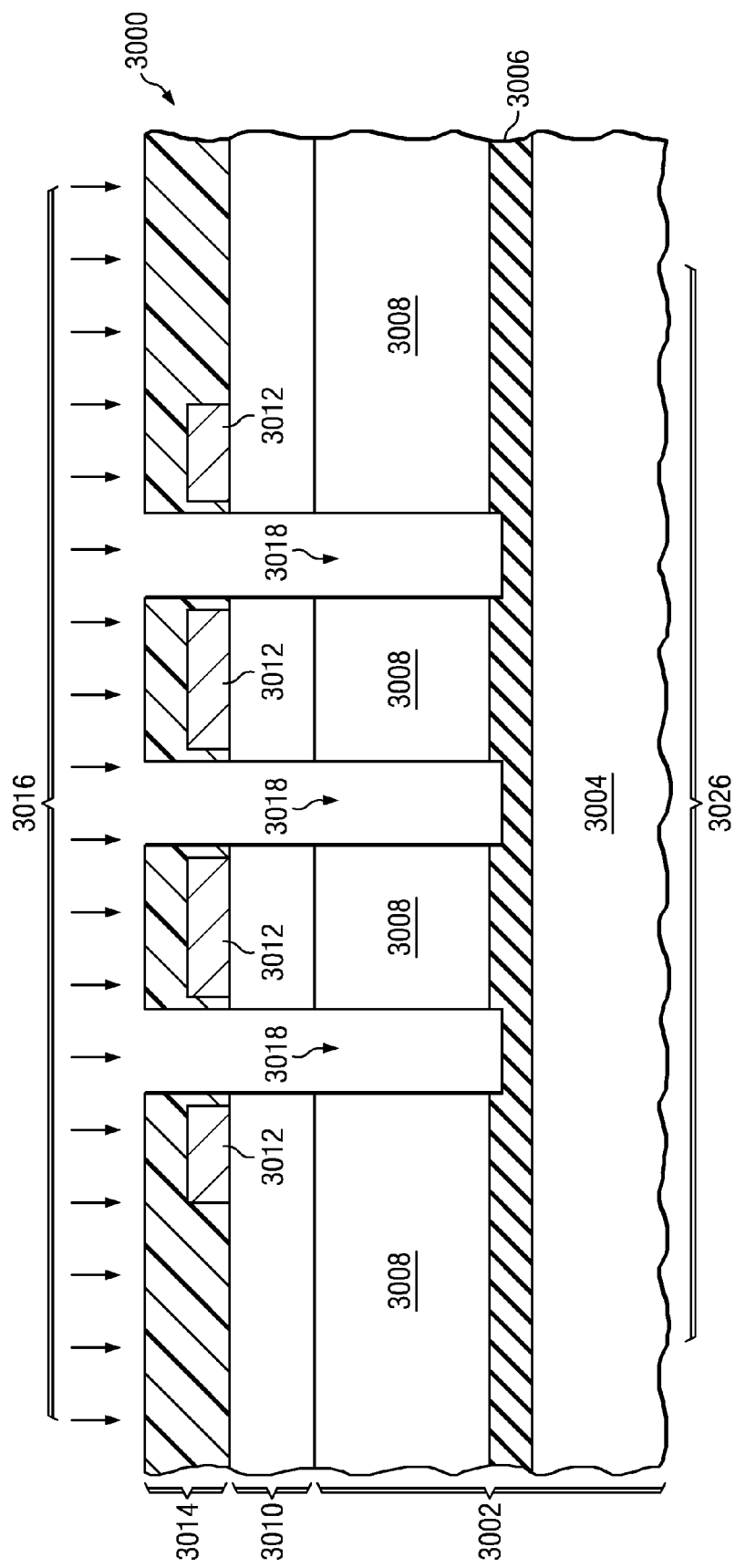
FIG. 3A through FIG. 3D are cross-sections of an integrated circuit containing a capacitive microphone transducer transducer formed according to a third embodiment, depicted in successive stages of fabrication.

FIG. 3A through FIG. 3D are cross-sections of an integrated circuit containing a capacitive microphone transducer formed according to a third embodiment, depicted in successive stages of fabrication. Referring to FIG. 3A, the integrated circuit (3000) is formed in and on a substrate (3002) which includes a base layer (3004), an etch stop layer (3006) and a top layer (3008). The base layer (3004) may be a silicon wafer or other material with suitable mechanical properties for the integrated circuit (3000). The etch stop layer (3006) may be silicon dioxide or other dielectric material, or may be a heavily doped silicon layer, for example a p-type layer with a dopant density above $10^{21}$ cm$^{-2}$. The top layer (3008) may be single crystal silicon, an epitaxial semiconductor layer, a polycrystalline silicon layer, or other material with suitable electrical properties for the integrated circuit (3000). In one realization of the instant embodiment, the substrate (3002) may be a SOI wafer, in which the etch stop layer (3006) includes a buried oxide layer of the SOI wafer.

An interconnect region (3010) is formed over the top layer (3008). A fixed plate (3012) is formed over the interconnect region (3010). An access trench photoresist pattern (3014) is formed over the interconnect region (3010). An access trench etch process (3016) as described in reference to FIG. 1B and FIG. 1C removes material from the interconnect region (3010) and the top layer (3008) to form access trenches (3018) which extend to and possibly into the etch stop layer (3006).

Figure 3B:
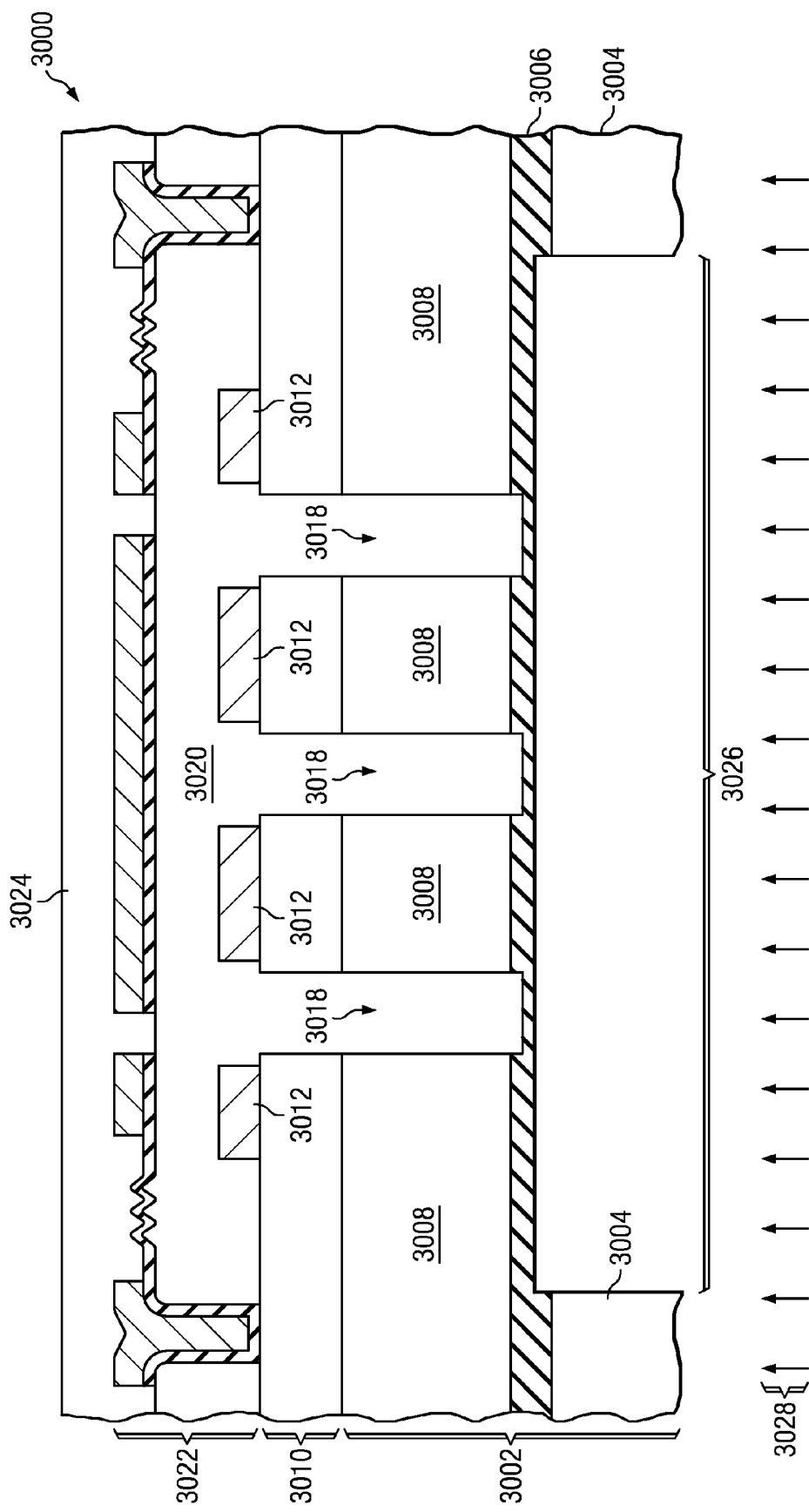

Referring to FIG. 3B, a cavity fill sacrificial layer (3020) formed over the interconnect region (3010) and in the access trenches (3018) as described in reference to FIG. 1D. Microphone transducer membranes (3022) are formed on the cavity fill sacrificial layer (3020) as described in reference to FIG. 1E. A sacrificial protective layer (3024) is formed over the microphone transducer membranes (3022) as described in reference to FIG. 1E. A backside cavity (3026) is formed in the base layer (3004) by a backside cavity etch process (3028), for example an RIE process, possibly combined with a wet etch using an aqueous solution of tetraethyl ammonium hydroxide (TMAH) or potassium hydroxide (KOH). The backside cavity (3026) extends to and possibly into the etch stop layer (3006).

Figure 3C:
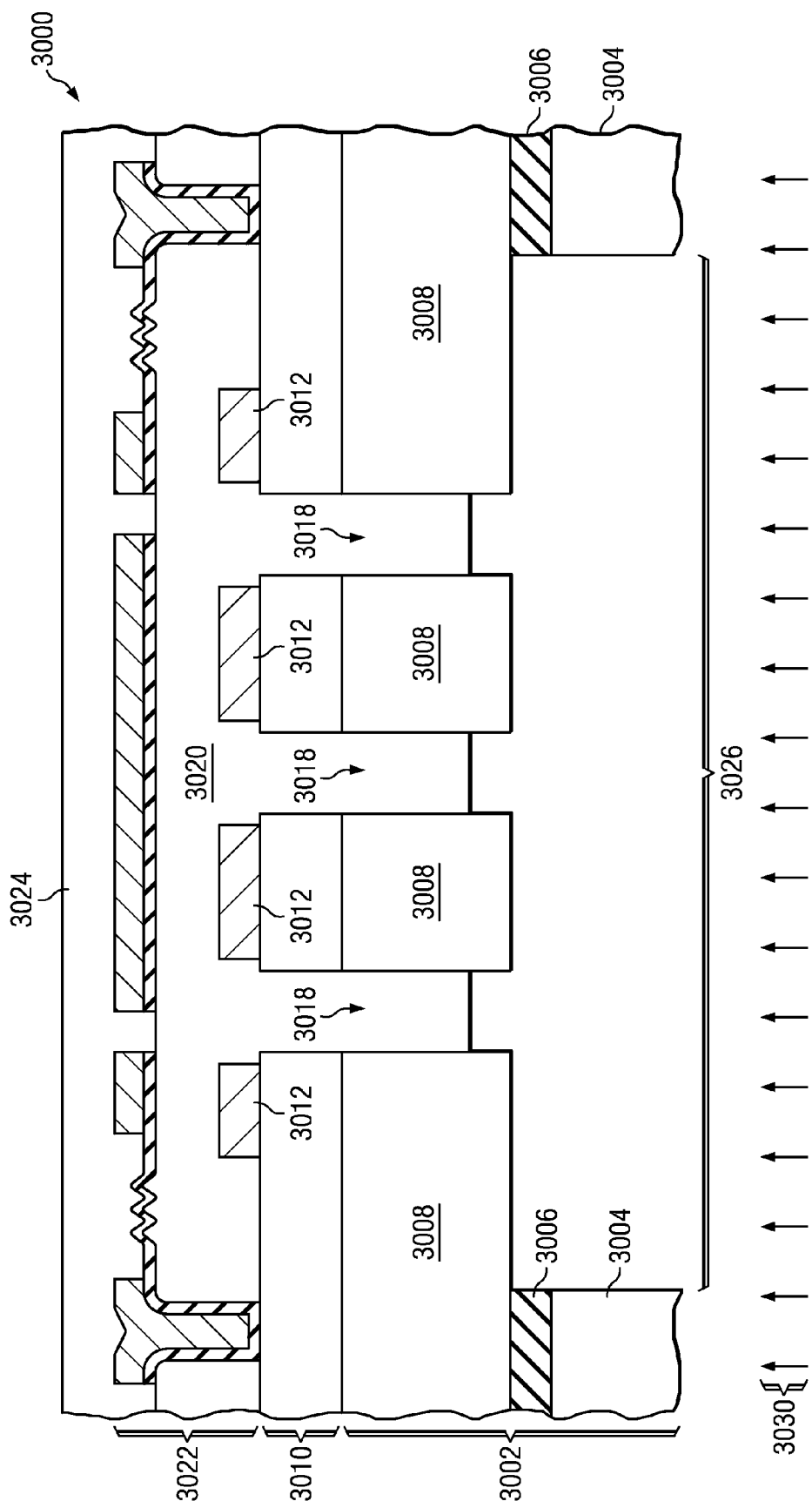

Referring to FIG. 3C, an etch stop layer punch through process (3030) is performed which removes material from the etch stop layer (3006) between the access trenches (3018) and the backside cavity (3026), exposing the cavity fill sacrificial layer (3020) at bottoms of the access trenches (3018). The etch stop layer punch through process (3030) may be a dry etch process such as an RIE process, a wet etch process such as an aqueous solution of dilute or buffered hydrofluoric acid (HF), or a vapor phase etch process such as exposing the etch stop layer (3006) to vapor phase anhydrous HF. In realizations of the instant embodiment in which the etch stop layer is crystalline silicon, the etch stop layer punch through process (3030) may be a wet etch including HF, nitric acid and acetic acid.

Figure 3D:
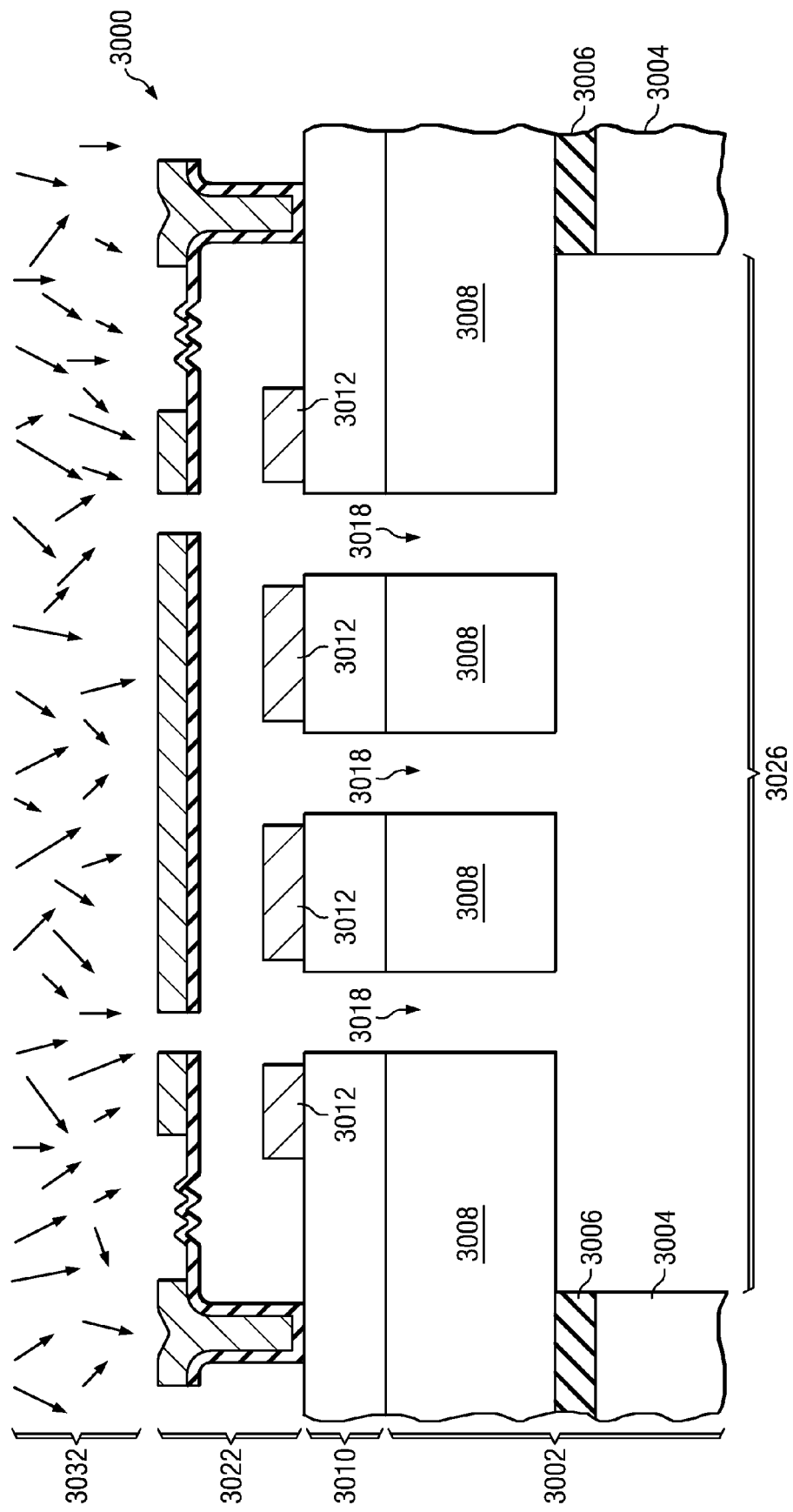

Referring to FIG. 3D, the cavity fill sacrificial layer (3020) in FIG. 3C and sacrificial protective layer (3024) in FIG. 3C are removed as described in reference to FIG. 1G, for example by exposing the integrated circuit (3000) to a reactive ambient (3032). The access trenches (3018) are connected to the backside cavity (3026).

Figure 4A:
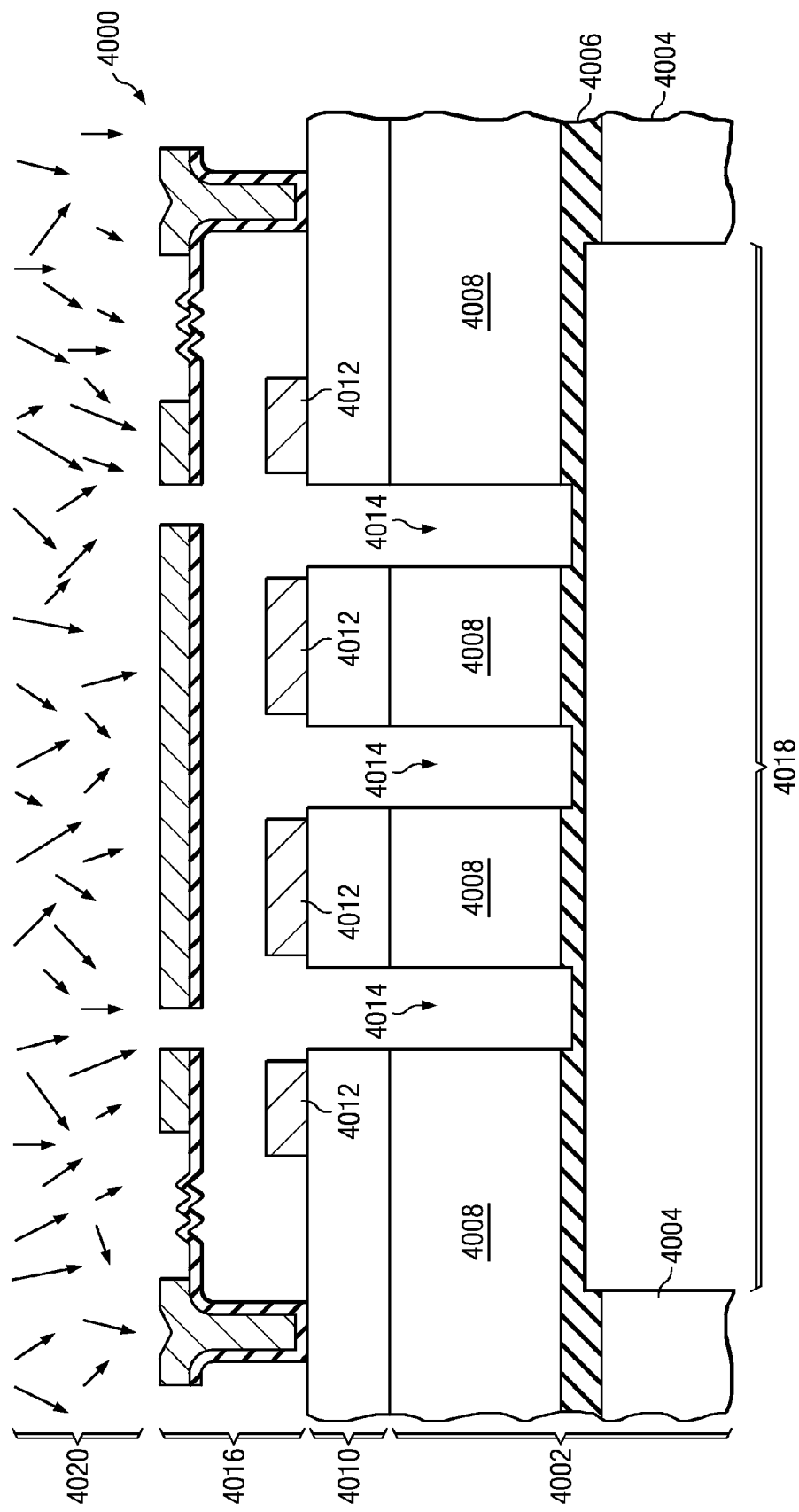
FIG. 4A and FIG. 4B are cross-sections of an integrated circuit containing a capacitive microphone transducer transducer formed according to a fourth embodiment, depicted in successive stages of fabrication.
Figure 4B:
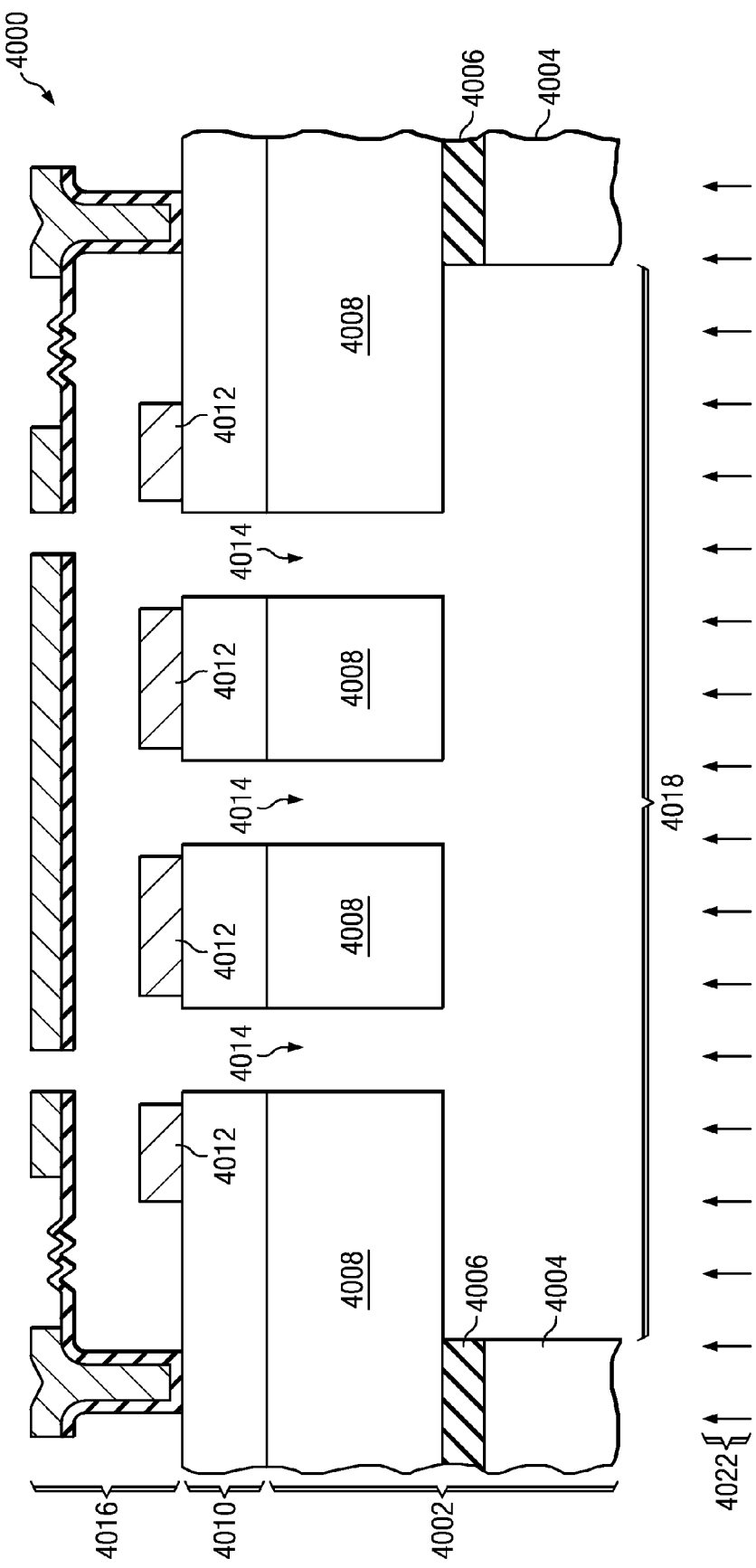

FIG. 4A and FIG. 4B are cross-sections of an integrated circuit containing a capacitive microphone transducer formed according to a fourth embodiment, depicted in successive stages of fabrication. Referring to FIG. 4A, the integrated circuit (4000) is formed on a substrate (4002) which includes a base layer (4004), an etch stop layer (4006) and a top layer (4008) as described in reference to FIG. 3A. An interconnect region (4010) is formed over the top layer (4008), and a fixed plate (4012) is formed over the interconnect region (4010), as described in reference to FIG. 3A. Access trenches (4014) are formed through the interconnect region (4010) and into the top layer (4008) so as to extend to and possibly into the etch stop layer (3006), as described in reference to FIG. 3A.

A cavity fill sacrificial layer (not shown) is formed over the interconnect region (4010) and in the access trenches (4014), microphone transducer membranes (4016) are formed on the cavity fill sacrificial layer, and a sacrificial protective layer (not shown) is formed over the microphone transducer membranes (4016) as described in reference to FIG. 3B. A backside cavity (4018) is formed in the base layer (4004) by a backside cavity etch process as described in reference to FIG. 3B. The backside cavity (4018) extends to and possibly into the etch stop layer (4006). The sacrificial protective layer and cavity fill sacrificial layer are removed as described in reference to FIG. 3D, for example by exposing the integrated circuit (4000) to a reactive ambient (4020).

Referring to FIG. 4B, an etch stop layer punch through process (4022) is performed which removes material from the etch stop layer (4006) between the access trenches (4014) and the backside cavity (4018). The etch stop layer punch through process (4022) may be similar to that described in reference to FIG. 3C. When the etch stop layer punch through process (4022) is completed, the access trenches (4014) are connected to the backside cavity (4018).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit containing a capacitive microphone transducer, comprising the steps:
   providing a substrate in which said substrate includes a base layer, an etch stop layer formed on said base layer, and a top layer formed on said etch stop layer;
   forming a first interconnect region on a top surface of said substrate;
   forming a fixed plate on a top surface of said first interconnect region;
   forming access trenches through said first interconnect region into said substrate; in which said step of forming said access trenches is performed so that said access trenches extend through said top layer;
   forming a sacrificial fill region of sacrificial material above said fixed plate;
   forming a first membrane layer on a top surface of said sacrificial fill region;
   forming a sacrificial protective layer of sacrificial material over a top surface of said first membrane layer;
   forming a backside cavity in said substrate, said backside cavity extending from a bottom surface of said substrate to said access trenches; in which said step of forming said backside cavity is performed so that said backside cavity extends through said base layer;
   removing a portion of said sacrificial material in said access trenches by a process of etching from a back side of said integrated circuit; and
   removing said sacrificial material from said sacrificial fill region.

2. The process of claim 1, in which said first membrane layer is formed concurrently with liner metal elements of interconnects in said integrated circuit.

3. The process of claim 1, in which said first membrane layer is selected from the group consisting of tantalum nitride, titanium nitride, titanium aluminum, aluminum, aluminum with copper, silicon nitride, silicon oxy-nitride, silicon carbide, silicon nitride carbide, and silicon oxy-nitride carbide.

4. The process of claim 1, in which said first membrane layer is formed so as to include a stress relief configuration.

5. The process of claim 1, further including forming a second membrane layer on a top surface of said first membrane layer, so that lateral edges of a main portion of said second membrane layer do not extend to lateral edges of said first membrane layer.

6. The process of claim 5, in which said second membrane layer is formed concurrently with elements of interconnects in said integrated circuit.

7. The process of claim 6, in which said second membrane layer is selected from the group consisting of copper, aluminum, and aluminum with copper.

8. The process of claim 1, in which said fixed plate is formed concurrently with elements of interconnects in said integrated circuit.

9. A process of forming an integrated circuit including a movable membrane, comprising:

forming an interconnect layer for interconnecting underlying circuit elements over a substrate;
forming a first conductive material layer over the interconnect layer;
patterning the first conductive layer to define a first capacitor plate positioned between and separated from second capacitor plate terminal contact points, and to form at least one cavity access opening through the capacitor plate;
selectively etching the interconnect layer through the at least one cavity access opening to form a corresponding at least one access trench down to the substrate;
forming a sacrificial layer over the patterned first conductive layer including over the first capacitor plate and the second capacitor plate terminal contact points and extending into the at least one trench;
patterning the sacrificial layer to expose the second capacitor plate terminal contact points peripherally of the first capacitor plate;
forming a second conductive material layer over the patterned sacrificial layer to define a second capacitor plate having a first portion spaced above the first capacitor plate and a second portion peripheral to the first portion extending down into contact with the exposed second capacitor plate terminal contact points;
forming a third conductive material layer on the second conductive material layer at least in the first portion of the second capacitor plate; the third conductive material layer having a main portion in contact with the first portion of the second capacitor plate but laterally spaced from the second portion of the second capacitor plate;
forming an opening which connects to the trenches in a backside of the substrate; and
removing at least enough of the sacrificial layer to define a cavity between the first portion of the second conductive material and the first capacitor plate in communication with the backside cavity through the cavity access openings and in which the first portion of the second capacitor plate may move in electrical attraction to or repulsion from the first capacitor plate; the second capacitor plate being dimensioned and configured to allow such movement.

10. The process of claim 9, further comprising patterning the second and third conductive material layers to define openings through the first portion of the second capacitor plate in communication with the cavity between the first portion and the first capacitor plate.

11. The process of claim 9, further comprising forming the second conductive material layer to provide a stress relief configuration between the first and second portions of the second capacitor plate.

12. The process of claim 9, further comprising forming the second conductive material layer to provide corrugations between the first and second portions of the second capacitor plate.

13. The process of claim 9, further comprising forming a second sacrificial layer over the second and third conductive material layers prior to forming the opening in the backside of the substrate; and removing the second sacrificial layer after forming the opening in the backside of the substrate.

14. A process of forming an integrated circuit including a movable membrane, comprising:
forming an interconnect layer for interconnecting underlying circuit elements over a substrate;
forming a first conductive material layer over the interconnect layer;
patterning the first conductive layer to define a first capacitor plate positioned between and separated from second capacitor plate terminal contact points, and to form at least one cavity access opening through the capacitor plate;
selectively etching the interconnect layer through the at least one cavity access opening to form a corresponding at least one access trench down to the substrate;
forming a sacrificial layer over the patterned first conductive layer including over the first capacitor plate and the second capacitor plate terminal contact points and extending into the at least one trench;
patterning the sacrificial layer to expose the second capacitor plate terminal contact points peripherally of the first capacitor plate;
forming a second conductive material layer over the patterned sacrificial layer to define a second capacitor plate having a first portion spaced above the first capacitor plate and a second portion peripheral to the first portion extending down into contact with the exposed second capacitor plate terminal contact points; further comprising forming the second conductive material layer to provide a stress relief configuration between the first and second portions of the second capacitor plate;
forming a third conductive material layer on the second conductive material layer at least in the first portion of the second capacitor plate; wherein the third conductive material layer is also formed on the second conductive material layer in the second portion of the second capacitor plate but not at the stress relief configuration;
forming an opening which connects to the trenches in a backside of the substrate; and
removing at least enough of the sacrificial layer to define a cavity between the first portion of the second conductive material and the first capacitor plate in communication with the backside cavity through the cavity access openings and in which the first portion of the second capacitor plate may move in electrical attraction to or repulsion from the first capacitor plate; the second capacitor plate being dimensioned and configured to allow such movement.

15. A process of forming an integrated circuit including a movable membrane, comprising:
forming an interconnect layer for interconnecting underlying circuit elements over a substrate;
forming a first conductive material layer over the interconnect layer;
patterning the first conductive layer to define a first capacitor plate positioned between and separated from second capacitor plate terminals, and to form cavity access openings through the capacitor plate;
selectively etching the interconnect layer through the cavity access openings to form corresponding access trenches down to the substrate;
forming a first sacrificial layer over the patterned first conductive layer including over the first capacitor plate and the second capacitor plate terminals and extending into the trenches;
patterning the first sacrificial layer to form vias peripherally of the first capacitor plate down to and exposing the second capacitor plate terminals;
forming a second conductive material layer over the patterned first sacrificial layer to define a second capacitor plate having a first portion spaced above the first capacitor plate and a second portion peripheral to the first portion extending down into the vias into contact with the exposed second capacitor plate terminals, wherein the second conductive material layer is formed with a stress relief configuration between the first and second portions of the second capacitor plate;

forming a third conductive material layer on the second conductive material layer over the first and second portions of the second capacitor plate including extending down into the vias, the third conductive material layer not present over the stress relief configuration;

forming an opening which connects to the trenches in a backside of the substrate; and removing the first sacrificial layer to define a cavity between the first portion of the second conductive material and the first capacitor plate in communication with the backside cavity through the cavity access openings and in which the first portion of the second capacitor plate may move in electrical attraction to or repulsion from the first capacitor plate; the second capacitor plate being dimensioned and configured to allow such movement.

\* \* \* \* \*